United States Patent [19]

Pulvirenti et al.

[11] Patent Number: 5,656,969

[45] Date of Patent: Aug. 12, 1997

[54] SLEW RATE CONTROL AND OPTIMIZATION OF POWER CONSUMPTION IN A POWER STAGE

[75] Inventors: Francesco Pulvirenti, Acireale; Gregorio Bontempo, Barcellona Pozzo di Gotto; Roberto Gariboldi, Lacchiarella, all of Italy

[73] Assignees: SGS-Thomson Microelectronics S.r.l., Agrate Brianza; Consorzio per la Ricerca Sulla Microelettronica nel Mezzogiorno, Catania, both of Italy

[21] Appl. No.: 449,855

[22] Filed: May 24, 1995

[30] Foreign Application Priority Data

May 25, 1994 [EP] European Pat. Off. ............ 94830249

[51] Int. Cl.$^6$ ............................................. H03K 17/687

[52] U.S. Cl. ...................... 327/561; 327/563; 327/108; 327/427; 327/379; 327/89

[58] Field of Search ................... 327/560–563, 327/108–112, 374, 376, 377, 383, 390, 379, 389, 427, 77, 89; 330/253, 277, 291, 261

[56] References Cited

U.S. PATENT DOCUMENTS

| | | | |
|---|---|---|---|
| 4,504,779 | 3/1985 | Haman | 327/108 |
| 4,514,648 | 4/1985 | Dotson et al. | 327/97 |
| 4,654,545 | 3/1987 | Giordano | 327/80 |
| 5,017,816 | 5/1991 | Wilcox | 327/432 |
| 5,021,682 | 6/1991 | Hobrecht | 327/563 |
| 5,023,474 | 6/1991 | Wilcox | 327/109 |
| 5,055,719 | 10/1991 | Hughes | 327/100 |
| 5,204,562 | 4/1993 | Pace | 327/381 |
| 5,289,051 | 2/1994 | Zitta | 327/379 |
| 5,404,053 | 4/1995 | Poma et al. | 327/108 |
| 5,422,587 | 6/1995 | Pulvirenti et al. | 327/427 |
| 5,425,526 | 9/1993 | Balakrishnan et al. | 327/77 |
| 5,469,094 | 11/1995 | Nessi | 327/108 |
| 5,543,739 | 8/1996 | Bontempo et al. | 327/108 |

FOREIGN PATENT DOCUMENTS

| | | |
|---|---|---|
| 0326968 | 8/1989 | European Pat. Off. . |
| 0397015 | 11/1990 | European Pat. Off. . |
| 0398170 | 11/1990 | European Pat. Off. . |
| 0535797 | 4/1993 | European Pat. Off. . |
| 225567 | 7/1985 | Germany . |
| 3536447 | 4/1987 | Germany . |
| 259944 | 9/1988 | Germany . |
| 1055066 | 6/1989 | Japan . |
| 2257854 | 1/1993 | United Kingdom . |

OTHER PUBLICATIONS

Patent Abstracts of Japan, vol. 13, No. 468 (E–834)(3816) Oct. 23, 1989 & JP–A–11 83214 (Toyota Autom Loom Works Ltd) Jul. 21, 1989 *abstract*.

Patent Abstracts of Japan, vol. 10, No. 356 (E–459)(2412) Nov. 29, 1986 & JP–A–61 154311 (Toshiba Corp) Jul. 14, 1986 *abstract*.

Thomson CSF GMBA, Technische Informationen Nr. 34/77, K. Rischmuller: "Basisansteuerung von Hochvolt–Schalttransistoren", pp. 1–31 *pp. 14–17; FIGS. 11A, 11B*.

*Primary Examiner*—Timothy P. Callahan
*Assistant Examiner*—Eunja Shin
*Attorney, Agent, or Firm*—Allen, Dyer, Doppelt, Milbrath & Gilchrist, P.A.

[57] ABSTRACT

Power consumption by the driving circuitry of an output stage, employing a slew-rate controlling operational amplifier, is reduced by modulating the level of the current output by the operational amplifier in function of the working conditions of the output stage. Switching delay may also be effectively reduced. An auxiliary current generator forces an additional current through the conducting one of the pair of input transistors of the operational amplifier only during initial and final phases of a transition, essentially when the slew rate control loop ceases to be effective. The boosting of the bias current through the conducting input transistor is determined by the degree of unbalance of the differential input stage of the operational amplifier, without the use of dissipative sensing elements.

24 Claims, 4 Drawing Sheets

SLEW RATE CONTROL AND OPTIMIZATION OF POWER CONSUMPTION IN A POWER STAGE

FIELD OF THE INVENTION

The present invention relates to a method and relative driving circuit of an output power stage which permits an effective slew rate control and wherein current absorption by the driving circuitry is optimized in function of the operating conditions of the output power stage.

BACKGROUND OF THE INVENTION

The so-called intelligent power switches are finding widespread industrial application. These devices can drive any kind of load (capacitive, inductive and/or resistive), referred to ground (in a high-side driver configuration) or to the power supply voltage (in a low-side driver configuration). They are called "intelligent" because on a single chip are integrated circuits capable of protecting and regulating in a real time mode the state of the integrated power switch (for example to protect the integrated power device from a short circuit etc).

At present, the most used technology for fabricating these integrated circuits is the so-called mixed or BCD technology (Bipolar-CMOS-DMOS). The integrated switch is often realized by a DMOS transistor, which, as compared with a bipolar transistor of similar current handling capacities, has the advantages of being voltage-driven, is capable of withstanding the maximum process voltage and has a lower saturation resistance.

On the other hand, in the field of industrial applications, the problem of electromagnetic disturbances that may be produced by continuous fast switchings of relays and equipment is very important. In order to minimize the electromagnetic noise that is produced, it is important to realize switches that are capable of ensuring suitably slow slew rates, in practice switching fronts having a controlled slope.

A common approach for switching-on and off a power transistor (power switch) with controlled switching fronts is that of loading and discharging the driving node of the transistor (the gate in the case of a field effect power transistor) with a constant current. Such a driving scheme, in case of a high-side driver employing a field effect power transistor (FET) is depicted in FIG. 1.

As well known to a skilled technician, such a solution does not permit perfectly controlled slew rates to be obtained because the slope of the switching front depends on the capacitance of the gate node; and this capacitance is not constant but assumes different values as the transistor passes from an off condition to a saturation condition and from the latter to a so-called linear working condition (i.e. an operating zone of its characteristic where the FET exhibits a resistive behaviour). Moreover, such a solution normally requires a circuitry capable of speeding up the passage from an off condition to a saturation condition at the beginning of a rising front and conversely at the end of the descending front, and also for speeding up the passing from a saturation condition to a linear operating condition at the end of a rising front and viceversa at the beginning of a descending front, in order to maintain the turn-on and turn-off delays acceptably small.

An alternative approach used for controlling the slew rate is based upon the use of a high gain operational amplifier, configured as an integrating stage, employing a capacitor C in its feedback line, as shown in FIG. 2.

Compared to the first solution, this alternative solution provides perfectly controlled switching fronts, because they are exclusively defined by the ratios between $I_{ON}/C$ and $I_{OFF}/C$.

On the other hand, the operational amplifier must be provided with an output stage capable of driving the gate of the power FET (for example a DMOS transistor) which may have a parasitic capacitance of a value that may be as low as ten odd pF and as large as several thousands pF and a broad band width in order to prevent oscillations.

Even though this last approach may theoretically achieve a perfect slew rate control by suitably dimensioning the current generators $I_{OFF}$ and $I_{ON}$ and the bootstrap capacitance C (which may also be connected externally of the integrated circuit and therefore adapted according to need), it has the drawback of being unable to optimize also power consumption and the switching delays.

For these reasons, this solution is seldom employed in systems and equipment where power consumption of the control circuitry and operation at a relatively high switching frequency are important considerations.

Moreover, in case of a power MOSFET, the driving must commonly be effected with a boosted voltage for reducing the resistance Ron of the power transistor. Therefore it is important that the current draw from the supply node of the final stage of the driving operational amplifier, which is adequately boosted by employing a charge pump circuit, be as slow as possible to avoid overloading the charge pump circuit.

SUMMARY OF THE INVENTION

Therefore there is the need and/or utility for an improved driving system which, beside allowing an easy slew rate control similar to that provided by a driving an integrating stage), also allows optimization of power consumption and limiting of turn-on and turn-off delays.

This objective is reached by the driving system of the invention which modulates the level of the current delivered by a driving operational amplifier and therefore current absorption, as a function of different operating conditions of the output power transistor.

At the base of the invention, there is the recognition of the fact that the current required to suitably drive the output power transistor depends on the zone of its characteristic in which the power transistor is functioning.

In case of a MOSFET, when the transistor is completely on or off, the only current that is necessary to provide to its gate is just that sufficient to counterbalance the leakage and to ensure the actual state of the transistor (on or off).

During rising and descending switching phases, the current required is equal to about:

$$I = C_{GATE} \cdot \frac{V_S}{T}$$

where $C_{GATE}$ is the capacitance seen from the gate node of the MOSFET, T represents the rise time or the fall time and $V_S$ is the supply voltage of the circuit.

This current is such as permit to the voltage swing of the output node to maintain a preset slope given by $I_{ON,OFF}/C$. Moreover, in order to speed up the passing from an off condition to a saturation condition, at the beginning of a rising front, and viceversa, at the end of a descending front, and also for speeding up the passage from a saturation condition to a "linear" condition, at the end of a rising front, and viceversa, at the beginning of a descending front, the current delivered by the driving amplifier should be suitably increased during these phases of the operating cycle of the power switch in order to reduce switching delays.

According to a first aspect of the invention, the current output by the driving operational amplifier and which is absorbed from the supply node of the final stage of the driving operational amplifier, is modulated as follows:

a) the current is minimum when the operational amplifier is completely unbalanced, a condition that occurs when the output power transistor is in a ON or in a OFF state;

b) the current is sufficient to ensure that the voltage on the output node of the circuit will vary according to a preset slope for the entire duration of a rising or of a descending transition, during which the driving operational amplifier works in linear condition (under the control exerted by its own feedback loop) and the output power transistor is in saturation;

c) the current is maximum when the output power transistor crosses in one sense or in the other, the boundary between the OFF region and its "linear behaviour" region (resistive behaviour) of its characteristic and the value of which has an influence on the turn-on and on the turn-off delay times.

In practice, the system of the invention implements a modulation of the level of the current that is output by the driving operational amplifier in function of the operating conditions of a differential input stage of the operational amplifier itself, which reflect corresponding operating conditions of the output power transistor driven by the operational amplifier, as will be clearly explained and illustrated further on in this description.

The modulation of the driving current delivered by the operational amplifier to the control node of the power transistor is implemented by a special circuit capable of selecting among different bias conditions of the differential input stage (that is of current absorption), in function of the state of unbalance of the same differential input stage. The differential input stage may be a transconductance stage having a differential current output, and a plurality of current mirrors implement a final, single-ended stage which drives the output power transistor.

BRIEF DESCRIPTION OF THE DRAWINGS

The different aspects and advantages of the invention will become more evident through the following description of several important embodiments and by referring to the attached drawings, wherein.

DESCRIPTION OF PREFERRED EMBODIMENTS

Figure 1:
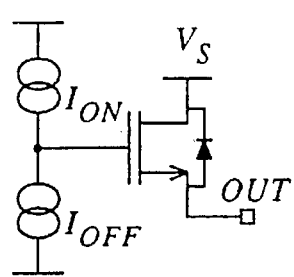
FIG. 1 is a basic circuit diagram for the driving of an output power transistor (high-side driver) as described above.
Figure 2:
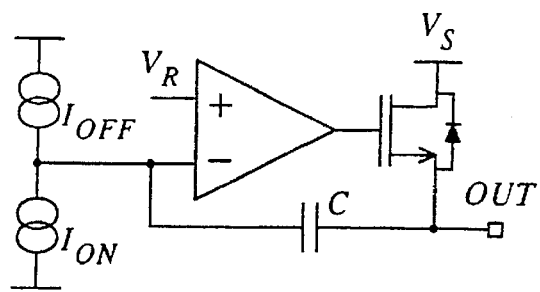
FIG. 2 is a basic circuit diagram for driving an output power transistor (high-side driver) by means of an integrating stage realized with a conventional operational amplifier, as described above.
Figure 3:
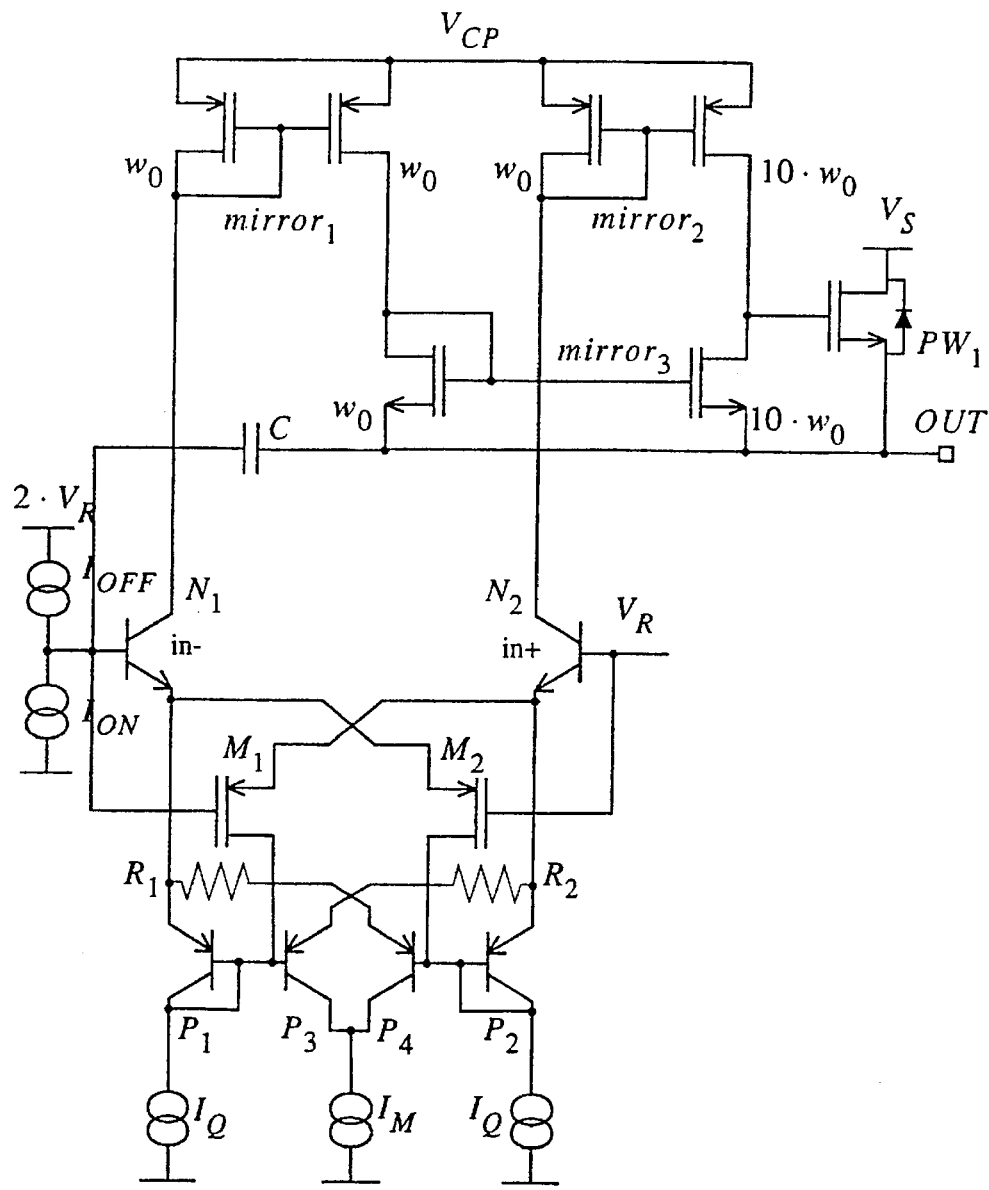
FIG. 3 shows a driving circuit for an output power transistor (high-side driver), made according to the present invention.

A driving circuit according to the present invention for a power transistor $PW_1$, configured as a high-side driver, is depicted in FIG. 3.

Basically, a circuit of this type is capable of driving any type of load and the output node OUT of the circuit may also assume negative potentials (below ground). The latter characteristic is often required in driving heavy inductive loads (of several Henry), in order to speed up the demagnetization of the load. Without this specific requirement, the current mirror, mirror3, could be referred to the ground potential instead of the output node potential, as in the shown example.

The driving operational amplifier comprises three current mirrors (mirror1, mirror2 and mirror3) which substantially form a final stage, and a differential input stage that is essentially composed of the differential pair of transistors $N_1$ and $N_2$ and the respective current generators $I_Q$.

The differential input stage of the operational amplifier is a transconductance stage with a differential current output (implemented through the drain currents of the transistors N1 and N2). The three current mirrors: mirror1, mirror2 and mirror3, form a final stage of the operational amplifier, the single-ended output of which may be directly connected to the gate of the output power transistor $PW_1$, as shown.

Of course, the mirror ratios of the second and third current mirrors: mirror2 and mirror3, which in the example shown are indicated as 1:10, may be of any suitable value, also a 1:1 ratio. Of course, a relatively large mirror ratio, as in the example shown, reduces current absorption in the differential input stage for the same level of output current.

According to the method of the present invention, the output current delivered by the driving operational amplifier is modulated in function of the state of operation of the circuit, by the circuit arrangement implemented with the transistors $M_1$ and $M_2$, the transistors $P_1$, $P_2$, $P_3$ and $P_4$ and with the auxiliary current generator $I_M$.

In general, all the current generators used in the circuit are not necessarily ideal generators but they are preferably realized with current mirror structures capable of delivering current as long as the voltage of their charge node remains close to the voltage to which they are referred (powered).

The transistors $M_1$ and $M_2$ are cross-coupled to the differential input pair of transistors of $N_1$ and $N_2$, and as the latter they are controlled by the signal present on the inverting input node in– of the operational amplifier and by the reference voltage $V_R$ applied to the noninverting input in+ of the amplifier, respectively.

$M_1$ and $M_2$ have the function of limiting the output current of the driving operational amplifier to a level given by $2I_Q$, when the transconductance differential input stage is completely out of balance, that is when the signal present on the inverting input in– reaches ground potential or the potential $2V_R$.

In fact, when the voltage on the input node in– drops below zero, the output transistor $PW_1$ is on and its gate is biased at the $V_{CP}$ voltage, which may be a boosted voltage generated by a charge pump circuit (not shown in the figures). Commonly, in order to suitably overdrive a power MOSFET, the boosted voltage $V_{CP}$ is about 10 V higher than the supply voltage $V_S$, in order to optimize the internal resistance $R_{DSon}$ of the power transistor. In these conditions of operation, the operational amplifier, that is its differential input stage, is completely out of balance.

In a state of full unbalance, in the above reiterated sense, of the differential input stage, the transistors $M_1$ and $P_2$ are on, while $M_2$, $P_1$, $P_3$ and $P_4$ are off. Therefore the transistor $N_2$, through its collector, absorbs from the boosted voltage node $V_{CP}$ a current given by $2I_Q$. This condition persists for the full range of variation of the voltage on the inverting input node in− comprised between zero and the voltage $V_{TH1}$, given by:

$$V_{TH1} = V_R - V_{BE}(N_2) - V_{TH}(M_1)$$

where $V_{TH1}$ is the threshold voltage of the transistor $M_1$.

A dual situation occurs when the output power transistor $PW_1$ is off. In this case, the inverting input in− of the driving operational amplifier is at the voltage $2V_R$. As a consequence $M_2$ and $P_1$ are on while $M_1$, $P_2$, $P_3$ and $P_4$ are off and in this case the transistor $N_1$ absorbs through its collector a current given by $2I_Q$. This condition persists for the whole range of values of the voltage on the inverting input node in− that are comprised between $2V_R$ and the voltage $V_{TH2}$, given by:

$$V_{TH2} = V_R + V_{BE}(N_1) + V_{TH}(M_2)$$

where $V_{TH2}$ is the threshold voltage of the $M_2$ transistor.

Clearly the current generators $I_Q$ may be sized so as to force a minimum current, that is a current that is just sufficient to compensate for leakage currents of the gate node of the output power transistor $PW_1$ and therefore maintain a conducting state or a cut-off state.

Figure 4:
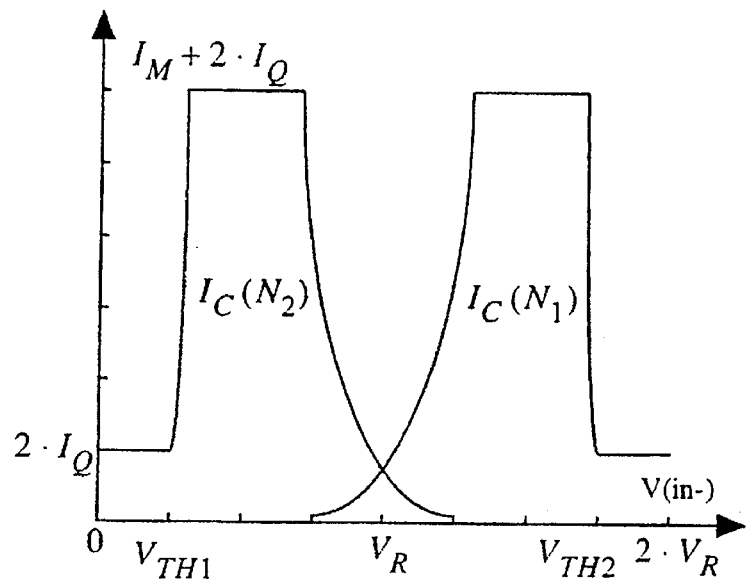
FIG. 4 shows diagrams of the driving current delivered by the operational amplifier of FIG. 3.

During a rising or descending transient (turn-on or turn-off of the power transistor), when the driving operational amplifier works in a linear manner, that is when the voltage on the inverting input node in− of the driving operational amplifier remains the vicinity of the reference voltage $V_R$, as diagrammatically depicted in FIG. 4, the feedback loop implemented by the capacitance C, assumes the control of the rise or fall slew rate thus ensuring a pre-established slope and the operational amplifier delivers the current that is necessary to charge or discharge the gate node of the output power transistor $PW_1$. In fact, in these conditions of operation, the collector currents $I_C(N_1)$ and $I_C(N_2)$ are tied to the voltages present on the inverting and on the noninverting inputs of the operational amplifier by the following transcendental relationships (corresponding to the exponential zones of the current diagrams of FIG. 4):

$$v(int) =$$
$$V_T \cdot \ln\left(\frac{I_C(N_1)}{I_C(N_2)}\right) + R_1 \cdot (I_C(N_1) - I_Q) + V_T \cdot \ln\left(\frac{I_C(N_1) - I_Q}{I_Q}\right)$$

$$-v(in) =$$
$$V_T \cdot \ln\left(\frac{I_C(N_2)}{I_C(N_1)}\right) + R_1 \cdot (I_C(N_2) - I_Q) + V_T \cdot \ln\left(\frac{I_C(N_2) - I_Q}{I_Q}\right)$$

At the beginning and at the end of a rise transient, respectively, the output power transistor passes from an off condition to a condition of linear operation and from the latter to a saturation condition. Similarly, at the beginning and at the end of a fall transient, the output power transistor passes from a saturation condition to a linear operation condition and from the latter to an off condition, respectively. During these phases, a relatively large charge or a discharge current of the driving node of the power transistor is required, for example in order to quickly reach the turn-on threshold $V_{TH}$ of the power transistor on turning on and at the end of the turn-on transient, in order to quickly bring the $V_{GS}$ voltage of the output power transistor to about 10 V in order to optimize the resistance $R_{DSon}$.

According to the present invention, such a momentary requirement for a relatively high output current of the driving operational amplifier is satisfied by allowing the respective transistor of the differential pair of the input stage of the operational amplifier to absorb a markedly larger current than the current $2I_Q$ that is fixed by the two current generators $I_Q$, through a dedicated auxiliary current generator $I_M$. This auxiliary current generator $I_M$ is designed so as to force through the collector of the transistor that is conducting of the input differential pair of transistors, an additional current $I_M$, which is much greater than the current $2I_Q$ forced by the two current generators $I_Q$ that bias the differential input stage. This is obtained by momentarily turning on one or the other of the two transistors $P_3$ and $P_4$, during a phase of relatively small unbalance of the differential input stage.

Figure 5:
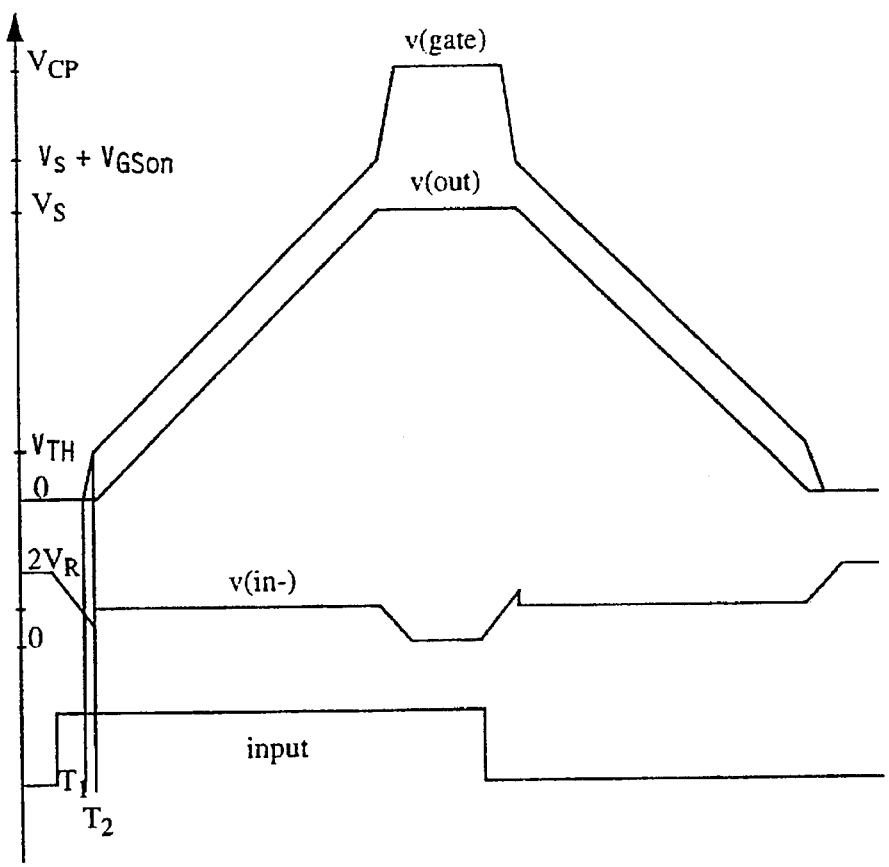
FIG. 5 shows diagrams of significant voltages of the circuit of FIG. 3, for an entire cycle of turning-on and turning-off of the output power transistor.

The explanation that follows will be more easily understood by referring also to the voltage diagram of FIG. 5.

In a turn-on phase of the output power transistor $PW_1$, the state of relatively small unbalance of the differential input stage of the operational amplifier coincides with the period during which the feedback loop of the operational amplifier is inactive, because the voltage on the gate node of the output power transistor has not yet risen above the turn-on threshold $V_{TH}$. As a consequence it is the transistor $P_3$ that turns on. Once the output voltage of the driving operational amplifier becomes greater than the threshold voltage $V_{TH}$, the output power transistor starts to conduct and therefore the feedback loop that controls the operation of the driving operational amplifier (the slew rate of the output voltage $V_{out}$) in the vicinity of the reference voltage $V_R$ is activated for the duration of the rise transient.

At the end of the rise transient, that is when the output voltage $V_{out}$ of the driving operational amplifier reaches the limit value, given by $V_S + V_{GSon}$, the voltage on the feedback capacitor C ceases to rise and also in this case the function of the feedback loop that controls the slope of the switching front (slew rate) ceases.

At this point, the transistor $P_3$ turns on again, thus allowing again the current forced by the driving operational amplifier (that is by the differential input stage) to rise to the maximum value, given by $I_M + 2I_Q$. In this way, the reaching of a full turn-on condition (overdrive) of the output power transistor is accelerated by quickly charging its control gate to the boosted voltage $V_{CP}$, which may be generated by a suitable charge pump circuit according to a common practice.

The turn-off of the output power transistor $PW_1$ occurs in a reverse manner.

Also in a turn-off phase, by the turning on of the transistor $P_4$, the maximum current given by the sum of: $I_M + 2I_Q$, is forced by the driving operational amplifier during a discharge of the gate node of the output power transistor from the overdrive voltage $V_{CP}$ to the voltage given by $V_S + V_{GSon}$. At this point, the feedback loop that controls the slope of the fall front (slew rate) becomes active as soon as the turn-off threshold $V_{TH}$ of the output power transistor is overcome, which disactivates the feedback loop and causes again the turning-on of the transistor $P_4$ and thus the forcing by the driving operational amplifier of the maximum current until the voltage $2V_R$ is reached by the inverting input node V(in-).

By referring to FIG. 5, during a turn-on phase of the output power transistor $PW_1$, the delay $T_1$ corresponds to time necessary for the inverting input node (v(in-)) to discharge, because of the turning-on of the current generator $I_{ON}$ and the turning-off of the current generator $I_{OFF}$, which are controlled by a pair of phase-opposed, logic signals (input and input\), during the drop of the v(in-) voltage from $2V_R$ down to $V_R$.

The delay $T_2$ represents the time necessary for the gate potential of the output power transistor to charge from ground potential up to a level beyond the turn-on threshold voltage $V_{TH}$.

It is this second contribution $T_2$ to the turn-on delay (and similarly also to the turn-off delay) that is advantageously reduced in the circuit of the invention by allowing the driving operational amplifier to deliver a relatively high current for quickly charging the gate node, during these phases.

Therefore the turn-on delay that is given by the sum during a turn-off phase.

On the other hand, by analyzing the first of the two delay factors, it may be observed that the time $T_1$ necessary for the inverting input of the operational amplifier to reach the reference voltage $V_R$ (starting from $2V_R$ on turning-on or from 0 on turning-off) is given by:

$$T_1 = \frac{V_R \cdot C}{I_{ON,OFF}}$$

where C is the feedback capacitance that controls the slew rate.

Figure 6:
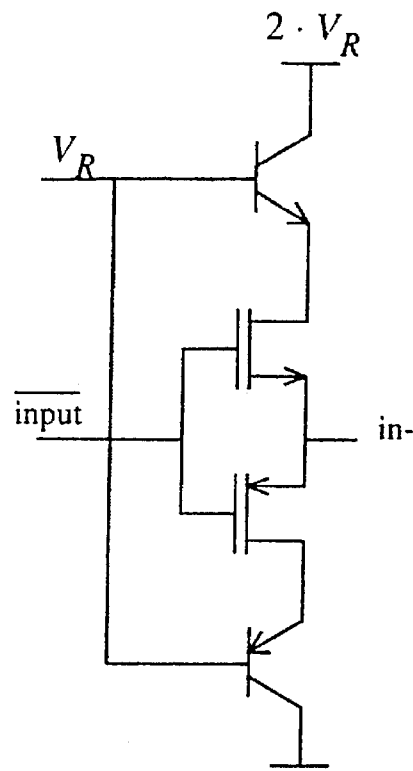
FIG. 6 shows an input circuit for a logic switching signal, suitable to reduce the turn-on and switching signal, suitable to reduce the turn-on and turn-off delay times.

Also such a first contribution to the switching delay (turn-off delay and turn-on delay) may be effectively reduced by employing a special input circuit as the one depicted in FIG. 6. By employing an input circuit as the one depicted in FIG. 6, the thus optimized delay $T_{1opt}$ is given by the following expression:

$$T_{1opt} = \frac{V_{BE} \cdot C}{I_{ON,OFF}}$$

In fact, with the input circuit of FIG. 6, the inverting input (in-) of the driving operational amplifier assumes instantaneously a $V_{BE}$ voltage.

Therefore, beside optimizing the $T_2$ contribution to the turn-on delay (and to the turn-off delay), also the $T_1$ may be markedly reduced by employing an input circuit as the one depicted in FIG. 6.

Of course, it is important to ensure stability of the circuit. In the example shown, the mid-band gain of the feedback loop is given by:

$$G_o = G_m \cdot R_G \cdot \frac{g_m \cdot R_L}{1 + g_m \cdot R_L}$$

where $R_G$ is the resistance seen from the gate node, $g_m$ is the transconductance of the output power transistor $PW_1$, $R_L$ is the load resistance and $G_m$ is given by the following relationship:

$$G_m = \frac{20}{\frac{2 \cdot V_T}{I_E} + R_1 + \frac{V_T}{I_E - I_Q}}$$

where $I_E$ may be derived from the following trascendental relationship:

$$R_1 \cdot (I_E - I_Q) = V_T \cdot \ln \frac{I_Q}{I_E - I_Q}$$

Resistances $R_1$ and $R_2$ of an appropriate value may be introduced (if necessary) in order to ensure stability of the circuit. Their effect is to make less steep the exponential rise and fall curves of the collector currents $I_C(N1)$ and $I_C(N2)$ in their respective diagrams shown in FIG. 4.

Basically the feedback capacitor C introduces a "zero" at the origin and a "pole" of value $p_1 = 1/R_V C$, where $R_V$ is the resistance seen by the capaciter C. The resistance $R_V$ is given by the sum of two contributions. The load resistance of the circuit $R_L$ (not shown in the circuit diagrams) and the resistance seen from the inverting node in- of the driving operational amplifier. Such a pole is the lowest because it is the one that determines the slew rate.

A second pole is introduced by the parasitic capacitance of the gate node of the output power MOSFET $PW_1$ and has a value given by $p_2 = 1/C_G R_G$. Other poles at higher frequencies are introduced by the operational amplifier. Therefore in designing the driving operational amplifier it is required that the pole $p_2$ remains dominant as compared with all the other poles.

Figure 7:
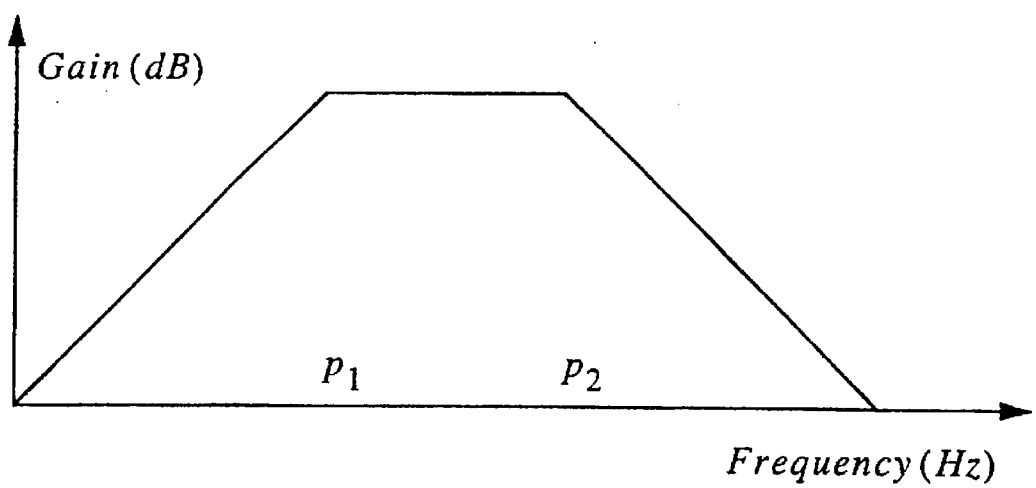
FIG. 7 is a diagram of the transfer function of the driving operational amplifier of FIG. 3, for a resistive load.

For a purely resistive load, the transfer function is graphically depicted in FIG. 7.

Of course, if the load is not purely resistive, the poles and zeroes that are introduced concur to modify the transfer function and therefore it is necessary to verify that the stability requirements be satisfied, case by case.

Figure 8:
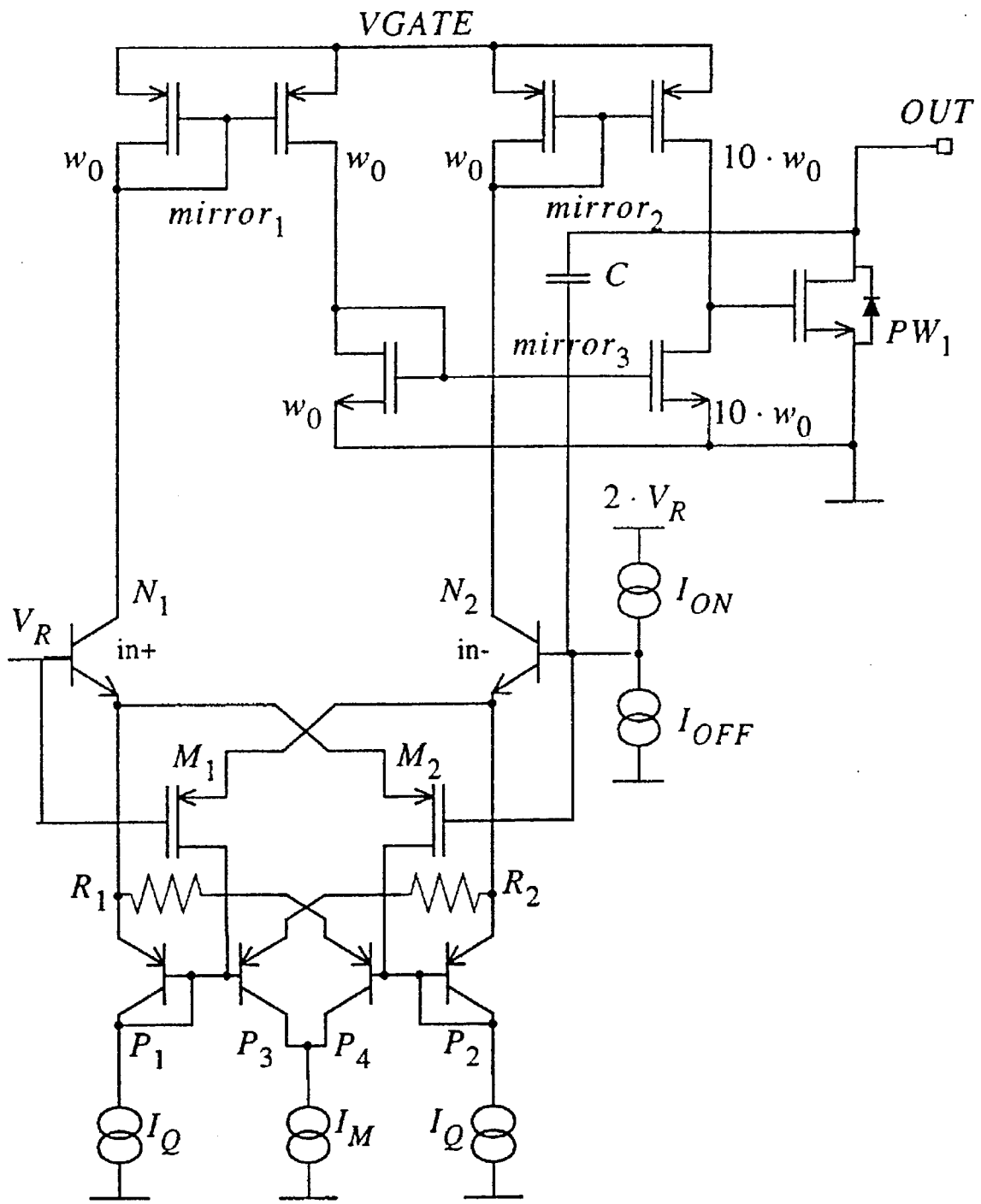
FIG. 8 shows a driving circuit made according to the present invention for an output power transistor configured as a low-side driver.

Of course the invention may be applied also in the case of a configuration of the output power transistor as a low-side driver. Such an alternative embodiment of the invention is depicted in the circuit diagram of FIG. 8, for which the same considerations that have been made above for the case of a high-side driver configuration, hold.

According to preliminary CAD simulations, the driving circuit of the invention permits to readily achieve turn-on and turn-off delay of about 400 nanoseconds with a slew-rate of about 5 V/μsec.

We claim:

1. A method of switchingly driving an output stage by a driving operational amplifier, said method comprising modulating the level of a current output by said driving operational amplifier in function of the working characteristic of said output stage, wherein said output stage comprises a field effect transistor and said method comprises the steps of:

delivering a driving current of a preset minimum value when said transistor is on or off and said driving operational amplifier is fully out of balance;

delivering a driving current of a preset maximum value when said transistor passes, in either direction, from an off region to a linear operation region of its working characteristic and said operational amplifier is in a state of limited unbalance;

delivering a driving current controlled by a feedback loop of said operational amplifier so that an output thereof varies with a preset slew rate during rising and descending transients and while said field effect power transistor is in saturation; and wherein the driving operational amplifier further comprises a transconductance, differential input stage and wherein modulation of the level of said current output by said driving operational amplifier is implemented by controlling a collector current of said differential input stage.

2. A driving method according to claim 1 wherein said differential input stage includes a pair of transistors, wherein said output stage has conditions of operation that disable control of said output current exerted by said feedback loop of said driving operational amplifier, wherein during conditions of operation of said output stage that disable control of said output current exerted by said feedback loop of said driving operational amplifier, modulation of the level of said output current is realized by enabling and disabling an auxiliary current generator forcing a certain current through a conducting transistor of said pair of transistors, dependent on the state of unbalance of said differential input stage.

3. A driving circuit for an output stage, employing a driving operational amplifier comprising a transconductance, differential input stage and a current mirror final stage, and a feedback capacitor connected between an output node of said differential input stage and an inverting input node of said differential input stage, characterised by comprising an auxiliary current generator capable of forcing a current markedly larger than a current forced by respective biasing current generators of a pair of transistors of said differential input stage; switching means controlled by a second pair of transistors, cross-coupled with the inputs of said differential input stage, capable of enabling and disabling current paths between each of said transistors of said differential input pair and said current generators.

4. A driving circuit as defined in claim 3, wherein said transistors of said differential input pair are bipolar NPN transistors, each having a collector connected to an input of a current mirror.

5. A driving circuit as defined in claim 4, wherein said transistors of said second pair are field effect transistors, each having a gate connected to a respective input of said differential input stage, a source connected to the emitter of the NPN transistor of the other input and a drain connected in common to a respective current generator and to the base of a pair of PNP transistors, the first of which has a collector connected to said current generator and an emitter connected to the emitter of the NPN transistor of said respective input while the other PNP transistor has a collector connected to said auxiliary current generator and an emitter connected to the emitter of the NPN transistor of said other input.

6. A driving circuit according to claim 5, wherein between the emitter of said second PNP transistor of each pair and the emitter of the transistor of the other input there is a stabilizing resistance.

7. A driving circuit as defined in claim 3, characterized by comprising an input circuit for a switching logic signal, composed of a complementary stage which comprises a first NPN transistor, a second n-channel field effect transistor, a third p-channel field effect transistor and a fourth bipolar PNP transistor, functionally connected in series with each other between a node maintained at a voltage that is twice the value of a reference voltage that is supplied to the non inverting input of said driving operational amplifier and a common ground node, the base of said first NPN transistor and of said fourth PNP transistor being connected in common to said reference voltage, the switching logic signal being applied to the gates connected in common of said second and third field effect transistors, the drains of which are connected in common to the non-inverting input node of the driving operational amplifier.

8. A power transistor gate driving circuit comprising:

a ramp voltage generator connected to drive one side of a differential input amplifier stage with a ramp voltage;

said differential input stage comprising first and second legs respectively connected to be biased by first and second current generators;

an additional current generator being operatively connected to increase the bias current through said differential input stage, after said ramp voltage ceases changing, until said differential input stage has been driven completely into imbalance in one direction or the other;

current mirroring stages connected to translate the current outputs of said differential input stage into current source and current sink drives for a power transistor gate connection; and a capacitively coupled feedback connection from a current carrying node of the power transistor to one of said input connections of said differential input stage.

9. The circuit of claim 8, wherein said first and second current generators are only large enough to compensate for leakage current.

10. The circuit of claim 8, wherein said additional current generator is larger than said first and second current generators.

11. The circuit of claim 8, further comprising stabilizing resistors interposed between said additional current generator and said differential input stage.

12. The circuit of claim 8, wherein said differential input stage comprises bipolar input transistors.

13. A power transistor gate driving circuit comprising:

a ramp voltage generator connected to drive one side of a differential input amplifier stage with a ramp voltage;

a capacitively coupled feedback connection from a current carrying node of the power transistor to said one side of said differential input stage;

said differential input stage comprising first and second legs respectively connected to be biased by first and second current generators;

an additional current generator being operatively connected to provide current of the same sign as provided by said current generators;

a supplemental drive subcircuit which connects the additional current generator to add current bias to said differential input stage at times when current through said capacitively coupled feedback connection has substantially ceased;

a cutoff subcircuit which is configured to cut off conduction of the additional current generator when either of said input transistors is fully off; and current mirroring stages connected to translate the current outputs of said differential input stage into current source and current sink drives for a power transistor gate connection.

14. The circuit of claim 13, wherein said first and second current generators are only large enough to compensate for leakage current.

15. The circuit of claim 13, wherein said additional current generator is larger than said first and second current generators.

16. The circuit of claim 13, wherein said differential input stage comprises bipolar input transistors.

17. The circuit of claim 13, wherein said cutoff subcircuit comprises MOS transistors and said supplemental drive subcircuit comprises bipolar transistors.

18. The circuit of claim 13, further comprising stabilizing resistors interposed between said additional current generator and said differential input stage.

19. A power transistor driving stage for a power transistor of a type having a current carrying node, said power transistor driving stage comprising:

a first differential pair of input transistors comprising first and second transistors;

first and second current generators connected to constantly bias said first and second transistors respectively;

a voltage ramp generator connected to bias a control terminal of said first transistor with a changing voltage having a controlled slew rate;

a capacitor which connects the current-carrying node of the power transistor to said control terminal of said first transistor;

an additional current generator, and supplemental transistors which are operatively connected to provide current from said additional current generator, when said input transistors are imbalanced, to whichever of said input transistors is then more strongly on; and additional transistors which are operatively connected to cut off current from said additional current generator when said input transistors are completely imbalanced.

20. The circuit of claim 19, wherein said first and second current generators are only large enough to compensate for leakage current.

21. The circuit of claim 19, wherein said additional current generator is larger than said first and second current generators.

22. The circuit of claim 19, further comprising stabilizing resistors interposed between said additional current generator and said differential input transistors.

23. The circuit of claim 19, wherein said input transistors are bipolar.

24. The circuit of claim 19, wherein said additional transistors are MOS and said supplemental transistors are bipolar.

\* \* \* \* \*